United States Patent
Clark et al.

(10) Patent No.: US 9,252,191 B2
(45) Date of Patent: Feb. 2, 2016

(54) SEED LAYER FOR A P+ SILICON GERMANIUM MATERIAL FOR A NON-VOLATILE MEMORY DEVICE AND METHOD

(75) Inventors: Mark Harold Clark, Santa Clara, CA (US); Scott Brad Herner, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 314 days.

(21) Appl. No.: 13/189,401

(22) Filed: Jul. 22, 2011

(65) Prior Publication Data
US 2013/0020548 A1    Jan. 24, 2013

(51) Int. Cl.
H01L 21/02   (2006.01)
H01L 27/24   (2006.01)
H01L 45/00   (2006.01)

(52) U.S. Cl.
CPC .......... H01L 27/2463 (2013.01); H01L 45/085 (2013.01); H01L 45/1233 (2013.01); H01L 45/1253 (2013.01); H01L 45/148 (2013.01); H01L 45/16 (2013.01); H01L 45/1616 (2013.01); H01L 45/1675 (2013.01); H01L 21/0262 (2013.01); H01L 21/02532 (2013.01)

(58) Field of Classification Search
CPC . B81C 1/0015; B81C 1/00626; G01P 15/125; G01P 15/0082; B81B 2203/0118; B81B 2201/014; H01H 59/0009; H01H 1/0036
USPC ......................................................... 438/382
See application file for complete search history.

(56) References Cited

U.S. PATENT DOCUMENTS

| | | |
|---|---|---|
| 680,652 A | 8/1901 | Elden |
| 4,433,468 A | 2/1984 | Kawamata |
| 4,684,972 A | 8/1987 | Owen et al. |

(Continued)

FOREIGN PATENT DOCUMENTS

| | | |
|---|---|---|
| JP | 2005-506703 A | 3/2005 |
| JP | 2006-032951 A | 2/2006 |

(Continued)

OTHER PUBLICATIONS

Jian Hu et al., "Area-Dependent Switching in Thin Film-Silicon Devices", Materials Research Society, Mal. Res. Soc. Symp Proc., 2003, pp. A18.3.1-A18.3.6, vol. 762.

(Continued)

*Primary Examiner* — Latanya N Crawford
(74) *Attorney, Agent, or Firm* — Amin, Turocy & Watson, LLP

(57) ABSTRACT

A method of forming a non-volatile memory device includes providing a substrate having a surface, depositing a dielectric overlying the surface, forming a first wiring structure overlying the dielectric, depositing silicon material overlying the first wiring structure, the silicon layer having a thickness of less than about 100 Angstroms, depositing silicon germanium material at a temperature raging from about 400 to about 490 Degrees Celsius overlying the first wiring structure using the silicon layer as a seed layer, wherein the silicon germanium material is substantially free of voids and has polycrystalline characteristics, depositing resistive switching material (e.g. amorphous silicon material) overlying the silicon germanium material, depositing a conductive material overlying the resistive material, and forming a second wiring structure overlying the conductive material.

20 Claims, 7 Drawing Sheets

(56) References Cited

U.S. PATENT DOCUMENTS

| | | |
|---|---|---|
| 4,741,601 A | 5/1988 | Saito |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,538,564 A | 7/1996 | Kaschmitter |
| 5,541,869 A | 7/1996 | Rose et al. |
| 5,594,363 A | 1/1997 | Freeman et al. |
| 5,614,756 A | 3/1997 | Forouhi et al. |
| 5,645,628 A | 7/1997 | Endo et al. |
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,973,335 A | 10/1999 | Shannon |
| 5,998,244 A | 12/1999 | Wolstenholme et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,259,116 B1 | 7/2001 | Shannon |
| 6,288,435 B1 | 9/2001 | Mei et al. |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,627,530 B2 | 9/2003 | Li et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,821,879 B2 | 11/2004 | Wong |
| 6,838,720 B2 | 1/2005 | Krieger et al. |
| 6,848,012 B2 | 1/2005 | LeBlanc et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,648,896 B2 * | 1/2010 | Herner ................ 438/510 |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,800,932 B2 * | 9/2010 | Kumar et al. ................ 365/148 |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,883,964 B2 | 2/2011 | Goda et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,948,010 B2 * | 5/2011 | Reshotko et al. ............. 257/190 |
| 7,968,419 B2 | 6/2011 | Li et al. |
| 7,972,897 B2 | 7/2011 | Kumar et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,207,064 B2 | 6/2012 | Bandyopadhyay et al. |
| 8,227,787 B2 | 7/2012 | Kumar et al. |
| 8,233,308 B2 | 7/2012 | Schricker et al. |
| 8,237,146 B2 | 8/2012 | Kreupl et al. |
| 8,265,136 B2 | 9/2012 | Hong et al. |
| 8,374,018 B2 | 2/2013 | Lu |
| 8,385,100 B2 | 2/2013 | Kau et al. |
| 8,394,670 B2 | 3/2013 | Herner |
| 8,467,227 B1 | 6/2013 | Jo |
| 8,658,476 B1 | 2/2014 | Sun et al. |
| 8,659,003 B2 | 2/2014 | Herner et al. |
| 2003/0141565 A1 | 7/2003 | Hirose et al. |
| 2003/0174574 A1 | 9/2003 | Perner et al. |
| 2003/0206659 A1 | 11/2003 | Hamanaka |
| 2004/0026682 A1 | 2/2004 | Jiang |
| 2004/0170040 A1 | 9/2004 | Rinerson et al. |
| 2004/0202041 A1 | 10/2004 | Hidenori |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0101081 A1 | 5/2005 | Goda et al. |
| 2005/0175099 A1 | 8/2005 | Sarkijarvi et al. |
| 2005/0260826 A1 * | 11/2005 | Dupuis et al. ................ 438/429 |
| 2006/0017488 A1 | 1/2006 | Hsu |
| 2006/0134837 A1 | 6/2006 | Subramanian et al. |
| 2006/0246606 A1 | 11/2006 | Hsu et al. |
| 2006/0281244 A1 | 12/2006 | Ichige et al. |
| 2006/0292301 A1 * | 12/2006 | Herner ................ 427/248.1 |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 * | 4/2007 | Kumar et al. ................ 257/295 |
| 2007/0091685 A1 | 4/2007 | Guterman et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |

(56) References Cited

U.S. PATENT DOCUMENTS

| | | |
|---|---|---|
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0185567 A1 | 8/2008 | Kumar et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278990 A1 | 11/2008 | Kumar et al. |
| 2008/0304312 A1 | 12/2008 | Ho et al. |
| 2008/0311722 A1* | 12/2008 | Petti et al. ............... 438/378 |
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0026582 A1* | 1/2009 | Herner ............... 257/616 |
| 2009/0052226 A1 | 2/2009 | Lee et al. |
| 2009/0095951 A1 | 4/2009 | Kostylev et al. |
| 2009/0152737 A1 | 6/2009 | Harshfield |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1 | 9/2010 | Sandoval |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0128779 A1 | 6/2011 | Redaelli et al. |
| 2011/0133149 A1 | 6/2011 | Sonehara |
| 2011/0136327 A1* | 6/2011 | Han et al. ............... 438/488 |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0205782 A1* | 8/2011 | Costa et al. ............... 365/148 |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0312151 A1 | 12/2011 | Herner |
| 2011/0317470 A1* | 12/2011 | Lu et al. ............... 365/148 |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | DeLucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0076203 A1 | 3/2012 | Sugimoto et al. |
| 2012/0080798 A1 | 4/2012 | Harshfield |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1 | 8/2012 | Lee et al. |
| 2012/0220100 A1 | 8/2012 | Herner |
| 2012/0235112 A1 | 9/2012 | Huo et al. |
| 2012/0236625 A1 | 9/2012 | Ohba et al. |
| 2012/0269275 A1 | 10/2012 | Hannuksela |
| 2012/0305874 A1 | 12/2012 | Herner |
| 2012/0326265 A1 | 12/2012 | Lai et al. |
| 2013/0026440 A1 | 1/2013 | Yang et al. |
| 2013/0168629 A1* | 7/2013 | Ribeiro et al. ............... 257/3 |
| 2014/0070160 A1 | 3/2014 | Ishikawa et al. |

FOREIGN PATENT DOCUMENTS

| | | |
|---|---|---|
| JP | 2007-067408 A | 3/2007 |
| JP | 2007-281208 A | 10/2007 |
| JP | 2007-328857 A | 12/2007 |
| KR | 1020110014248 A | 2/2011 |
| WO | WO 03/034498 A1 | 4/2003 |
| WO | WO 2009/005699 A1 | 1/2009 |
| WO | WO 2011/133138 A1 | 10/2011 |

OTHER PUBLICATIONS

André Dehon, "Array-Based Architecture for FET-Based, Nanoscale Electronics", IEEE Transactions on Nanotechnology, Mar. 2003, pp. 23-32, vol. 2, No. 1, IEEE.

Herb Goronkin et al., "High-Performance Emerging Solid-State Memory Technologies", MRS Bulletin, www.mrs.org/publications/bulletin, Nov. 2004, pp. 805-813.

Gerhard Müller et al., "Status and Outlook of Emerging Nonvolatile Memory Technologies", IEEE, 2004, pp. 567-570.

A.E. Owen et al., "Memory Switching in Amorphous Silicon Devices", Journal of Non-Crystalline Solids 59 & 60, 1983, pp. 1273-1280, North Holland Publishing Company/Physical Society of Japan.

J. Campbell Scott, "Is There an Immortal Memory?", www.sciencemag.org, Apr. 2, 2004, pp. 62-63, vol. 304 No. 5667, American Association for the Advancement of Science.

S.H. Lee et al., "Full Integration and Cell Characteristics for 64Mb Nonvolatile PRAM", 2004 Symposium on VLSI Technology Digest of Technical Papers, IEEE, 2004, pp. 20-21.

Stephen Y. Chou et al., "Imprint Lithography With 25-Nanometer Resolution", Science, Apr. 5, 1996, pp. 85-87, vol. 272, American Association for the Advancement of Science.

S. Zankovych et al., "Nanoimprint Lithography: challenges and prospects", Nanotechnology, 2001, pp. 91-95, vol. 12, Institute of Physics Publishing.

A. Avila et al., "Switching in coplanar amorphous hydrogenated silicon devices", Solid-State Electronics, 2000, pp. 17-27, vol. 44, Elsevier Science Ltd.

Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.

S. Hudgens et al., "Overview of Phase-Change Chalcogenide Nonvolatile Memory Technology", MRS Bulletin, www.mrs.org/publications/bulletin, Nov. 2004, pp. 829-832.

K. Terabe et al., "Quantized conductance atomic switch", Nature, www.nature.com/nature, Jan. 6, 2005, pp. 47-50, vol. 433, Nature Publishing Group.

(56) References Cited

OTHER PUBLICATIONS

Michael Kund et al., "Conductive bridging RAM (CBRAM): An emerging non-volatile memory technology scalable to sub 20nm", IEEE, 2005.
W. Den Boer, "Threshold switching in hydrogenated amorphous silicon", Appl. Phys. Letter, 1982, pp. 812-813, vol. 40, American Institute of Physics.
P.G. Lecomber et al., "The Switching Mechanism in Amorphous Silicon Junctions", Journal of Non-Crystalline Solids,1985, pp. 1373-1382, vol. 77 & 78, Elsevier Science Publishers B.V., North Holland Physics Publishing Division, North-Holland, Amsterdam.
A. E. Owen et al., "Switching in amorphous devices", INT. J. Electronics, 1992, pp. 897-906, vol. 73, No. 5, Taylor and Francis Ltd.
M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012..
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, 10, 1297-1301, 2010, pubs.acs.org/NanoLett, A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", $9^{th}$ Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/p⁺a-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.

(56) References Cited

OTHER PUBLICATIONS

A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct. 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti—W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.

Notice of Allowance for U.S. Appl. No. 13/532,019 dated Nov. 14, 2012.
Office Action for U.S. Appl. No. 13/149,653 dated Nov. 20, 2012.
Notice of Allowance for U.S. Appl. No. 12/814,410, dated Jan. 8, 2013.
Corrected Notice of Allowance for U.S. Appl. No. 12/861,666, dated Jan. 11, 2013.
Supplemental Notice of Allowance for U.S. Appl. No. 12/894,087, dated Jan. 11, 2013.
Notice of Allowance for U.S. Appl. No. 13/314,513, dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264, dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432, dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312, filed on Jul. 2, 2012.
Office Action for U.S. Appl. No. 13/466,008, dated Jul. 29, 2013.
Russo, Ugo et al., "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, No. 2.
Cagli, C. et al., "Evidence for threshold switching in the set process of NiO-based RRAM and physical modeling for set, reset, retention and disturb prediction", IEEE International Electron Devices Meeting, Dec. 15-17, 2008, pp. 1-4, San Francisco, CA.
Office Action for U.S. Appl. No. 13/077,941, dated Aug. 12, 2013.
Office Action for U.S. Appl. No. 13/436,714, dated Aug. 27, 2013.
Notice of Allowance for U.S. Appl. No. 13/679,976, dated Sep. 17, 2013.
Office Action for U.S. Appl. No. 13/189,401, dated Sep. 30, 2013.
Office Action for U.S. Appl. No. 13/462,653, dated Sep. 30, 2013.
Corrected Notice of Allowance for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665, dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowance for U.S. Appl. No. 13/452,657, dated Oct. 10 2013.
Notice of Allowance for U.S. Appl. No. 13/174,264, dated Oct. 16, 2013.
Notice of Allowance for U.S. Appl. No. 13/417,135, dated Oct. 23, 2013.
Office Action of U.S. Appl. No. 13/436,714, dated Dec. 7, 2012.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 13/434,567, dated Feb. 6, 2014.
Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 12/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.

(56) References Cited

OTHER PUBLICATIONS

Office Action for U.S. Appl. No. 13/143,047, dated Apr. 11, 2014.
Office Action for U.S. Appl. No. 13/761,132, dated Apr. 25, 2014.
Office Action for U.S. Appl. No. 13/705,082, dated Sep. 2, 2014.
Office Action for U.S. Appl. No. 13/739,283, dated Sep. 11, 2014.
Office Action for U.S. Appl. No. 13/756,498, dated Sep. 12, 2014.
Notice of Allowance for U.S. Appl. No. 13/462,653 dated Sep. 17, 2014.
Notice of Allowance for U.S. Appl. No. 13/586,815, dated Sep. 18, 2014.
Notice of Allowance for U.S. Appl. No. 13/920,021, dated Sep. 18, 2014.
Office Action for U.S. Appl. No. 13/189,401, dated Sep. 22, 2013.
Notice of Allowance for U.S. Appl. No. 13/594,665 dated Sep. 26, 2014.
Notice of Allowance for U.S. Appl. No. 13/077,941, dated Oct. 8, 2014.
Notice of Allowance for U.S. Appl. No. 13/077,941, dated Aug. 27, 2014.
Office Action for U.S. Appl. No. 12/835,704, dated Mar. 1, 2012, 15 pages.
Office Action for U.S. Appl. No. 12/835,704, dated Jun. 8, 2012 3 pages.
International Search Report for PCT/US2011/046035 mailed Sep. 5, 2011, 1 page.
Moopenn, et al., "Programmable Synaptic Devices for Electronic Neural Nets", Control and Computers, 1990, pp. 37-40, vol. 18, No. 2, 5 pages.
Comber, "Present and Future Applications of Amorphous Silicon and Its Alloys", Journal of No-Crystalline Solids 115, 1989, pp. 1-13, Elsevier Science Publishers B.V., North-Holland, 13 pages.
Hu, et al., "AC Characteristics of Cr/p/sup +/A-Si:HIV Analog Switching Devices." IEEE Transactions on Electron Devices, Sep. 2000, pp. 1751-1757, vol. 47, No. 9, 7 pages.
Owen, et al. "New Amorphous-silicon electrically programmable nonvolatile switching device," Solid-State and Electron Devices, IEEE Proceedings I, Apr. 1982, pp. 51-54, vol. 129, No. 2, 4 pages.
Jo, et al., "CMOS Compatible Nanoscale Nonvolatile Resistance Switching Memory," Nano Letters, 2008, pp. 392-397, vol. 8, No. 2, American Chemical Society Publications, 6 pages.
Hajto, et al., "Analogue memory and ballistic electron effects in metal-amorphous silicon structures," Philosophical Magazine B, 1991, pp. 349-369, vol. 63, No. 1, Taylor & Francis Ltd., 21 pages.
Holmes, et al., Design of Analogue Synapse Circuits using Non-Volatile a-Si:H Memory Devices, Proceedings of ISCAS, 1994, pp. 351-354, 4 pages.
Dong, et al., "Si/a-Si Core/Shell Nanowires as Nonvolatile Crossbar Switches" Nono Letters, Jan, 2008, pp. 386-391, vol. 8, No. 2, 6 pages.
Supplementary European Search Report for Application No. EP09819890.6 dated Mar. 27, 2012, 5 pages.
Muller, et al., "The Electronic Structure at the Atomic Scale of Ultrathin Gate Oxides", Nature, Jun. 1998, pp. 758-761, vol. 399, No. 24, 4 pages.
Sune, et al., "Nondestructive Multiple Breakdown Events in Very Thin Si02 Films", Applied Physics Letters, 1989, vol. 55 No. 128, 4 pages.
Marand, "Materials Engineering Science", MESc 5025 Chapter 7, University of Vermont, http://www.files.chem.vt.edu/chemdeptimarand/MEScchap6-1 c.pdf, 15 pages.
Owen, et al., "Electronic switching in amorphous silicon devices: properties of the conducting filament", proceedings of the 5th International Conference o Solid-State and Integrated Cicuit Technology, 1998, pp. 830-833, 4 pages.
Jo, "Nanoscale Memristive Devices for Memory and Logic Applications", Thesis, University of Michigan, 2010, 153 pages.
Office Action for U.S. Appl. No. 12/894,098 dated Aug. 1, 2012, 24 pages.
Office Action for U.S. Appl. No. 12/582,086 dated Apr. 19, 2011, 13 pages.
Office Action for U.S. Appl. No. 12/582,086 dated Sep. 6, 2011, 6 pages.
Notice of Allowance for U.S. Appl. No. 12/582,086 dated Oct. 21, 2011, 8 pages.
Notice of Allowance for U.S. Appl. No. 13/905,074 dated Oct. 8, 2013, 11 pages.
Written Opinion of the International Searching Authority for PCT/US2009/061249 mailed May 19, 2010, 3 pages.
Office Action for U.S. Appl. No. 12/861,650, dated Oct. 16, 2012, 10 pages.
Notice of Allowance for U.S. Appl. No. 12/894,087, dated Oct. 25, 2012, 9 pages.
Notice of Allowance for U.S. Appl. No. 13/149,807, dated Oct. 29, 2012, 9 pages.
Notice of Allowance for U.S. Appl. No. 12/861,666, dated Nov. 14, 2012, 9 pages.
Office Action for U.S. Appl. No. 13/156,232 dated Nov. 26, 2012, 8 pages.
Notice of Allowance for U.S. Appl. No. 13/290,024, dated Nov. 28, 2012, 9 pages.
Notice of Allowance for U.S. Appl. No. 12/814,410 dated Jan. 8, 2013, 8 pages.
Corrected Notice of Allowance for U.S. Appl. No. 12/861,666 dated Jan. 11, 2013, 6 pages.
Supplemental Notice of Allowance for U.S. Appl. No. 12/894,087 dated Jan. 11, 2013, 2 pages.
Notice of Allowance for U.S Appl. No. 13/314,513 dated Jan. 24, 2013, 5 pages.
Notice of Allowance for U.S. Appl. No. 13/733,828 dated Aug. 8, 2013, 10 pages.
Office Action for U.S. Appl. No. 13/462,653 dated Sep. 30, 2013, 11 pages.
Notice of Allowance for U.S. Appl. No. 13/769,152 dated Oct. 8, 2013, 10 pages.
Notice of Allowance for U.S. Appl. No. 1/31452,657 dated Oct. 10, 2013, 11 pages.
Notice of Allowance for U.S. Appl. No. 13/174,264 dated Oct. 16, 2013, 7 pages.
Notice of Allowance for U.S. Appl. No. 13/417,135 dated Oct. 23, 2013, 11 pages.
Notice of Allowance for U.S. Appl. No. 13/725,331 dated Jan. 17, 2014, 8 pages.
Office Action for U.S. Appl. No. 13/739,283 dated Jan. 16, 2014, 12 pages.
Office Action for U.S. Appl. No. 13/920,021 dated Jan. 10, 2014, 8 pages.
Office Action for U.S. Appl. No. 12/861,432 dated Jan. 8, 2014, 14 pages.
Office Action for U.S. Appl. No. 13/586,815 dated Jan. 29, 2014, 12 pages.
International Search Report for PCT/US2013/061244 mailed Nov. 7, 2013, 1 page.
Office Action for U.S. Appl. No. 12/835,699 dated Aug. 24, 2011, 11 pages.
Notice of Allowance for U.S. Appl. No. 12/835,699 dated Feb. 6, 2012, 7 pages.
Supplementary European Search Report for European Application No. 11870128.3 dated Apr. 2, 2015, 5 pages.
Office Action for U.S. Appl. No. 12/833,898 dated Apr. 5, 2012, 8 pages.
European Search Report for Application No. EP11005207.3 dated Oct. 12, 2011, 5 pages.
Notice of Allowance for U.S. Appl. No. 12/833,898 dated May 30, 2012, 5 pages.
Notice of Allowance for U.S. Appl. No. 12/939,824 dated May 11, 2012, 9 pages.
Notice of Allowance for U.S. Appl. No. 12/940,920 dated Oct. 5, 2011, 8 pages.
Office Action for U.S. Appl. No. 13/314,513 dated Mar. 27, 2012, 5 pages.
Yin, "Solution Processed Silver Sulfide Thin Films for Filament Memory Applications", Technical Report No. UCB/EECS-2010-166, http://www.eecs.berkeley.edu/Pubs/TechRpts/2010/Eecs-

(56) References Cited

OTHER PUBLICATIONS 2010-166.html, Dec. 17, 2010, Electrical Engineering and Computer Sciences, University of California at Berkeley, 121 pages.
Office Action for U.S. Appl. No. 13/149,653 dated Apr. 25, 2012, 16 pages.
Office Action for U.S. Appl. No. 13/870,919 dated Apr. 3, 2014, 20 pages.
Office Action for U.S. Appl. No. 13/167,920 dated Mar. 12, 2014, 15 pages.
Lecomber, et al., "The Switching Mechanism in Amorphous Silicon Junctions", Journal of Non-Crystalline Solids 77 &78, 1985, pp. 1373-1382, North-Holland, Amsterdam, 10 pages.
Den Boer, "Threshold Switching in Hydrogenated Amorphous Silicon", American Institute of Physics, 1982, pp. 812-813, 3 pages.
Dehon, "Array-Based Architecture for FET-Based, Nanoscale Electronics", IEEE Transactions on Nanotechnology, Mar. 2003, pp. 23-32, vol. 2, No. 1, 10 pages.
Goronkin, et al., "High Performance Emergin Solid-State Memory Technologies", MRS Bulletin, Nov. 2004, pp. 805-813, www.mrs.org/publications/bulletin, 9 pages.
Muller, et al., "Status and Outlook of Emerging Nonvolatile Memory Technologies", IEEE, 2004, pp. 567-570, 4 pages.
Owen, et al., "Memory Switching in Amorphous Silicon Devices", Journal of Non-Crystalline Solids 59 & 60, 1983, pp. 1273-1280, North-Holland Publishing Company, 8 pages.
Scott, "Is There an Immortal Memory?", www.sciencemag.org, Apr. 2, 2004, pp. 62-63, vol. 304, No. 5667, 3 pages.
Lee, et al., "Full Integration and Cell Characteristics for 64Mb Novolatile PRAM", 2004 Symposium on VLSI Technology Dgest of Technical Papers, pp. 20-21, 2004 IEEE, 2 pages.
Chou, et al., "Imprint Lithography With 25-Nonometer Resolution", Science, Apr. 5, 1996, pp. 85-87, vol. 2725, 4 pages.
Zankovych, et al., "Nanoimprint Lithography: Challenges and Prospects", Institute of Physics Publishing, Nanotechnology 12, 2001, pp. 91-95, 6 pages.
Avila, et al., "Switching in Coplanar Amorphous Hydrogenated Silicon Devices", Solid-State Electronics 44, 2000, pp. 17-27, 11 pages.
Hu, et al., "Switching and Filament Formation in Hot-Wire CVD P-Type A-Si:H Devices", Science Direct, Thin Solid Films 430, 2003, pp. 249-252, www.sciencedirect.com, 4 pages.
Hudgens, et al., "Overview of Phase-Change Chalcogenide Nonvolatile Memory Technology", MRS Bulletin, Nov. 2004, pp. 829-832, www.mrs.org/publications/bulletin, 4 pages.

Terabe, et al, "Quantized Conductance Atomic Switch", Nature, vol. 433, Jan. 6, 2005, pp. 47-50, www.nature.com/nature, 4 pages.
Kund, et al., "Conductive Bridging Ram (CBRAM): An Emerging Non-Volatile Memory Technology Scalable to Sub 20nm", IEEE, 2005, 4 pages.
Owen, et al., "Switching in Amorphous Devices", Int. J. Electronics, 1992, pp. 897-906, vol. 73, No. 5, 4 pages.
Jafar, et al., "Switching in Amorphous-Silicon Devices", The American Physical Society, 1994, pp. 611-615, vol. 49, No. 19, 5 pages.
Stikeman, "Polymer Memory—The Plastic Path to Beller Data Storage", Technology Review, Sep. 2002, p. 31, www.technologyreview.com, 1 page.
Chen, et al., "Nanoscale molecular-switch crossbar circuits," Nanotechnology 14, 2003, pp. 462-468, vol. 1.14, Institute of Physics Publishing, 7 pages.
Collier, et al., "Electronically Configurable Molecular-Based Logic Gates", Science, Jul. 16, 1999, pp. 391-395, vol. 285, No. 5426, 5 pages.
Office Action for U.S. Appl. No. 11/875,541, dated Jul. 22, 2010, 14 pages.
Office Action for U.S. Appl. No. 11/875,541, dated Mar. 30, 2011, 14 pages.
Office Action for U.S. Appl. No. 11/875,541, dated Oct. 5, 2011 13 pages.
Office Action for U.S. Appl. No. 11/875,541, dated Jun. 8, 2012, 11 pages.
Choi, "Molecular Electronic Crossbar Memory Circuits", Bistable (2)Rotaxane Based Molecular Electronics: Fundamentals and Applications, Chapter 3, pp. 79-124, Dissertion, California Institute of Technology, 59 pages.
Jo, et al, "A Silicon-Based Crossbar Ultra-High-Density Non-Volatile Memory", SSEL Annual Report 2007, 1 page.
International Search Report and Written Opinion for PCT/US2009/060023 mailed May 18, 2010, 6 pages.
Waser, et al., "Nanoionics-based Resistive Swtiching Memories", Nature Materils, Nov. 2007, pp. 833-835, vol. 6, 8 pages.
Notice of Allowability for U.S. Appl. No. 13/158,231, dated Apr. 17, 2012, 7 pages.
Office Action for U.S. Appl. No. 12/826,653 dated May 8, 2012, 10 pages.
International Search Report for PCT/US2011/040090 mailed Feb. 17, 2012, 5 pages.
Office Action for U.S. Appl. No. 12/835,704, dated Sep. 21, 2011, 14 pages.

\* cited by examiner

SEED LAYER FOR A P+ SILICON GERMANIUM MATERIAL FOR A NON-VOLATILE MEMORY DEVICE AND METHOD

BACKGROUND

The present invention is generally related to resistive switching devices. More particularly, embodiments according to the present invention provide a method and a structure to form a low temperature crystalline silicon material for a resistive switching device. Embodiments according to the present invention can be applied to non-volatile memory devices but it should be recognized that the present invention can have a much broader range of applicability.

From the above, a new semiconductor device structure and integration is desirable.

BRIEF SUMMARY OF THE PRESENT INVENTION

The present invention is generally related to resistive switching devices. More particularly, embodiments according to the present invention provide a method and a structure to form a low temperature crystalline silicon material for a resistive switching device. Embodiments according to the present invention can be applied to non-volatile memory devices but it should be recognized that the present invention can have a much broader range of applicability.

In a specific embodiment, a method for forming a resistive switching device is provided. The method includes providing a substrate having a surface region and depositing a first dielectric material overlying the surface region of the substrate. A first wiring structure is formed overlying the first dielectric material. The first wiring structure is elongated in shape and spatially configured to extend in a first direction in a specific embodiment. The method includes depositing a silicon material overlying the first wiring structure. In a specific embodiment, the silicon layer is characterized by a thickness of no greater than about 60 Angstroms. A silicon germanium material is deposited at a depositing temperature raging from about 400 Degree Celsius to about 490 Degree Celsius overlying the first wiring structure using the silicon material as a seed layer. The silicon germanium material is substantially free of voids and has a crystalline characteristic in a specific embodiment. The method includes depositing a resistive switching material overlying the silicon germanium material. In a specific embodiment, the resistive switching material comprising an amorphous silicon material. A conductive material is formed overlying at least the resistive material and a second wiring structure is formed overlying at least the conductive material.

In a specific embodiment, a resistive switching device is provided. The device includes a first wiring structure. The first wiring structure is elongated in shape and spatially configured to extend in a first direction in a specific embodiment. The device includes a junction layer comprising a silicon germanium material overlying the first wiring structure. In a specific embodiment, the silicon germanium material has a p+ impurity characteristic and a crystalline characteristic. In a specific embodiment, the device includes a resistive switching material comprising an amorphous silicon material overlying the junction layer and a second wiring structure overlying the resistive switching material. In a specific embodiment, the second wiring structure is elongated in shape and spatially configured to extend in a second direction orthogonal to the first direction. In some embodiments, the resistive switching device is disposed in an N by M crossbar array in a specific embodiment, where N and M are integers (N≥1, M≥1).

Many benefits can be achieved by ways of the present invention over conventional techniques. For example, embodiments according to the present invention provide a method to form a silicon germanium material at a low temperature for fabrication of a non-volatile memory device. The low temperature is compatible with thermal budget of conventional CMOS processes (e.g. back-end CMOS process) and provide easy integration to the process flow. Additionally, the silicon germanium material may be doped using impurity species (for example a boron species) to provide for a suitable conductivity for proper operation of the non-volatile memory device in a specific embodiment. Moreover, embodiments of the methods use conventional semiconductor processing techniques without modification to the equipments. Depending upon the embodiment, one or more of these benefits may be achieved. One skilled in the art would recognize other modifications, variations, and alternatives.

In various embodiments, the resistive memory described herein may provide many benefits, including low power consumption memories, non-volatile memories, and the like. In various embodiments, devices including processors, communications interfaces, and the like may incorporate such resistive memory devices. Such devices may include computers, computing tablets, portable phones, e-readers, or the like. Accordingly, such devices may be considered within the scope of the present inventions.

According to one aspect of the invention, a method of forming a non-volatile memory device, is described. One technique includes providing a substrate having a surface region, depositing a first dielectric material overlying the surface region of the substrate, and forming a first wiring structure overlying the first dielectric material. A process includes depositing a silicon material overlying the first wiring structure, the silicon layer being characterized by a thickness of no greater than about 100 Angstroms, and depositing a silicon germanium material at a depositing temperature raging from about 400 Degree Celsius to about 490 Degree Celsius overlying the first wiring structure using the silicon material as a seed layer, the silicon germanium material being substantially free of voids and having a polycrystalline characteristic. A method includes depositing a resistive switching material comprising an amorphous silicon material overlying the silicon germanium material, depositing a conductive material overlying the resistive material, and forming a second wiring structure overlying the conductive material.

According to another aspect of the invention, a resistive switching device, comprising is described. One product includes a first wiring structure, spatially configured to extend in a first direction, and a junction layer overlying the first wiring structure comprising a silicon germanium material having a p+ impurity characteristic and a polycrystalline characteristic. A device includes a resistive switching material comprising an amorphous silicon material overlying the junction layer, and a second wiring structure, spatially configured to extend in a second direction orthogonal to the first direction.

According to yet another aspect of the invention, a device is manufactured according to various processes. One process includes providing a substrate having a surface region, depositing a first dielectric material overlying the surface region of the substrate, and forming a first wiring structure overlying the first dielectric material. A technique includes depositing a silicon material overlying the first wiring structure, the silicon layer being characterized by a thickness of no greater than about 100 Angstroms, and depositing a silicon germanium material at a depositing temperature raging from about 400 Degree Celsius to about 490 Degree Celsius overlying the first wiring structure using the silicon material as a seed layer, the silicon germanium material being substantially free of voids and having a polycrystalline characteristic. A method includes depositing a resistive switching material comprising an amorphous silicon material overlying the silicon germanium material, depositing a conductive material overlying the resistive material, and forming a second wiring structure overlying the conductive material.

DETAILED DESCRIPTION OF THE PRESENT INVENTION

The present invention is generally related to resistive switching devices. More particularly, embodiments according to the present invention provide a method and a structure to form a low temperature crystalline silicon material for a resistive switching device. Embodiments according to the present invention can be applied to non-volatile memory devices but it should be recognized that the present invention can have a much broader range of applicability.

Resistive switching behavior has been observed and studied in micrometer-scale amorphous silicon (a-Si) devices since the 1980s. A typical device consists of a pair of metal electrodes sandwiching an amorphous silicon layer in a so-called Metal/a-Si/Metal (M/a-Si/M) structure, in which the voltage applied across the pair of metal electrodes causes changes in the resistance of the a-Si material. These conventional M/a-Si/M based switching devices can have the advantages of high Ion/Ioff ratios, and can be fabricated with a CMOS compatible fabrication process and materials. However, these devices usually require high voltage for operation, have poor endurance characteristics, and cannot be scaled to nanometers, as demanded by present consumer electronics application.

To further decrease cost per bit, device shrinking and process simplification is necessary. To achieve proper switching of the device, defect level in an interface region formed between the amorphous silicon switching material and a metal electrode would have to be controlled. The defect level can be controlled by using a suitable silicon material disposed between the electrode material and the amorphous silicon switching material. Embodiments according to the present invention provide a method to form a silicon germanium material and a structure to form a non-volatile memory with desirable switching characteristic and device reliability.

The terms "bottom" and "top" are for references and illustration only and not meant to be limiting.

Figure 1:
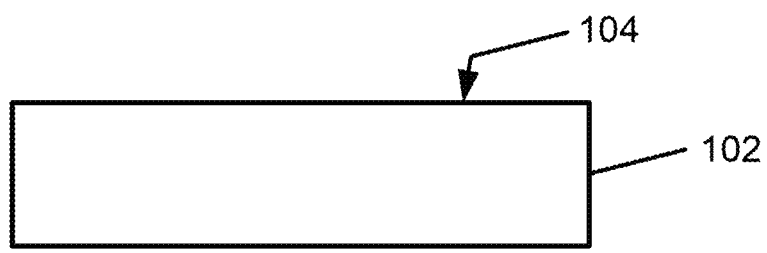
FIG. 1-11 are simplified diagrams illustrating a method of forming a non-volatile memory device according to an embodiment of the present invention.

FIG. 1-11 are simplified diagrams illustrating a method for forming a resistive switching device for a non-volatile memory device according to an embodiment of the present invention. As shown in FIG. 1, a semiconductor substrate 102 having a surface region 104 is provided. The semiconductor substrate can be a single crystal silicon wafer, a silicon germanium material, a silicon on insulator (commonly called SOI) depending on the embodiment. In certain embodiments, the semiconductor substrate can have one or more MOS devices formed thereon. The one or more MOS devices can be controlling circuitry for the resistive switching device in a specific embodiment.

Figure 2:
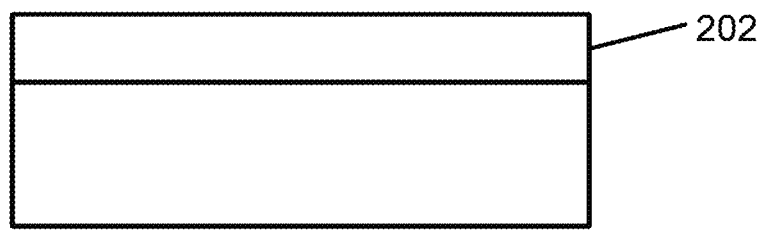
Figure 3:
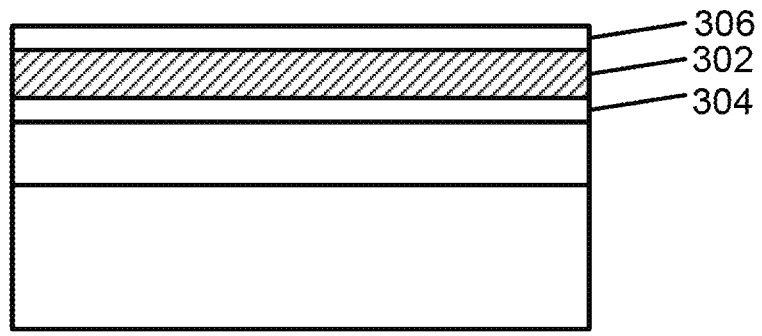

As illustrated in FIG. 2, the method includes depositing a first dielectric material 202 overlying the semiconductor substrate. The first dielectric material can be silicon oxide, silicon nitride, a dielectric stack of alternating layers of silicon oxide and silicon nitride (for example, an ONO stack), a low K dielectric, a high K dielectric, or a combination, and others, depending on the application. The first dielectric material 202 can be deposited using techniques such as chemical vapor deposition, including low pressure chemical vapor deposition, plasma enhanced chemical vapor deposition, atomic layer deposition (ALD), physical vapor deposition, including any combination of these, and others Referring to FIG. 3, the method includes depositing a first wiring material overlying the first dielectric material. The first wiring material can be a suitable metal material including alloy materials, or a semiconductor material having a suitable conductivity characteristic. The metal material can be tungsten, aluminum, copper or silver, and others. Additionally, the first wiring metal may be a combination of conductive materials. In various embodiments, these metal materials may be deposited using a physical vapor deposition process, chemical vapor deposition process, electroplating, or electrodeless deposition process, including any combinations of these, and others. The semiconductor material can be, for example, a suitably doped silicon material in certain embodiments.

In certain embodiments, a first adhesion material 304 is first formed overlying the first dielectric material before deposition of the first wiring material to promote adhesion of the first wiring material to the first dielectric material. A diffusion barrier material 306 may also be formed overlying the metal material to prevent the metal material to contaminate other portions of the device in a specific embodiment.

Figure 4:
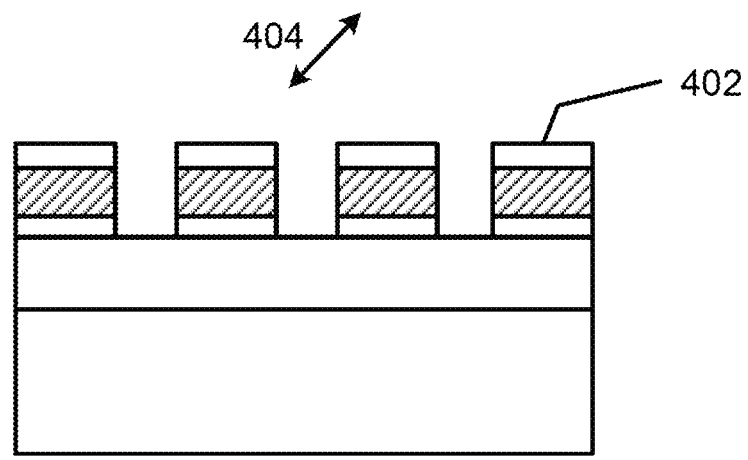

The method subjects the first wiring material to a first pattern and etching process to form a first wiring structure 402 in a specific embodiment. As shown in FIG. 4, the first wiring structure includes a plurality of first elongated structures that may extend in a first direction 404 in a specific embodiment.

Figure 5:
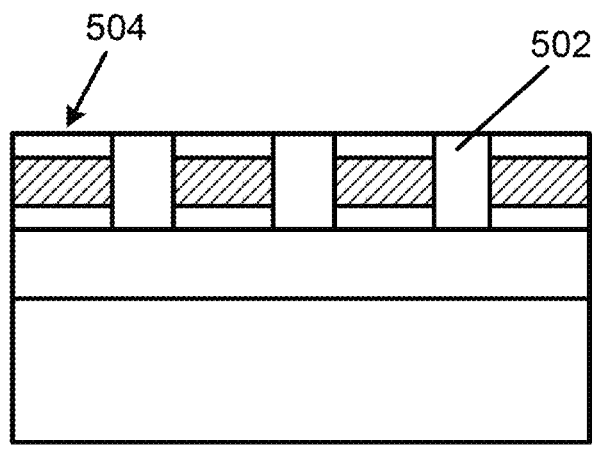

In a specific embodiment, the method deposits a second dielectric material 502 overlying the first wiring structure. The second dielectric material can be silicon oxide, silicon nitride, a dielectric stack of alternating layers of silicon oxide and silicon nitride (for example, an ONO stack), a low K dielectric, a high K dielectric, or a combination, and others, depending on the application. The second dielectric material can be subjected to a planarizing process to isolate the first wiring structure in a specific embodiment. As shown in FIG. 5, a surface region 504 of the diffusion barrier material may be exposed after chemical or mechanical planarizing.

Figure 6:
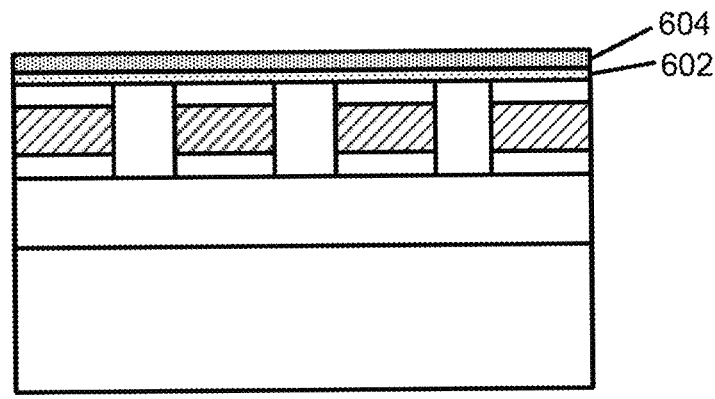

Referring to FIG. 6, the method includes forming a first silicon material 602 overlying at least the first wiring structure and the exposed surface of the second dielectric material. The first silicon material can be formed using a deposition process such as a low pressure chemical vapor deposition process a plasma enhanced chemical vapor deposition process using silane ($SiH_4$) or disilane ($Si_2H_6$), or a suitable chlorosilane depending on the application. Alternatively, the first silicon material can be deposited using a physical vapor deposition process from a suitable silicon target. Deposition temperature can range from about 380 Degree Celsius to about 450 Degree Celsius, and preferably not higher than 440 Degree Celsius. In a preferred embodiment, the first silicon material is deposited using a low pressure chemical vapor deposition process using disilane at a deposition temperature ranging from about 400 Degree Celsius to about 460 Degree Celsius. The first silicon material layer is further characterized by a thickness of no greater than about 100 Angstroms and in some cases less than about 50 Angstrom in a specific embodiment.

Referring again to FIG. 6, embodiments of the method deposit a junction material 604 overlying the first wiring structure using the first silicon material as a seed layer for junction material 604. The junction material can be a suitable semiconductor material in a specific embodiment. In a specific embodiment, the semiconductor material can be a polycrystalline silicon germanium (poly-SiGe) material. In various embodiments, the polycrystalline silicon germanium material can be doped with a suitable impurity species to have a desirable conductivity. The polycrystalline silicon germanium material can be deposited using a chemical vapor deposition process such as a low pressure chemical vapor deposition process, a plasma enhanced chemical vapor deposition process, atomic layer deposition (ALD) and others. Depending on the application, precursors such as silane and germane in a suitable carrier gas may be used. In a specific embodiment, the polycrystalline silicon germanium material can have a p+ impurity characteristic.

In various embodiments, the p+ impurity characteristic can be provided using a boron species, an aluminum species or a gallium species and the likes, depending on the application. In a specific embodiment, the p+ impurity species is provided by a boron species co-deposited with silane and germane. The boron species can be provided the using diborane in a specific embodiment. Ex-situ deposition may also be used, depending on the embodiment. Deposition temperature ranges from about 380 Degree Celsius to about 460 Degree Celsius and in some cases ranges from about 400 Degree Celsius to about 440 Degree Celsius. In a specific embodiment, the as deposited p+ silicon germanium material has a crystalline characteristic without further anneal. In a specific embodiment, the boron doped silicon germanium material has a lower crystalline temperature than an undoped silicon germanium material. Additionally, the p+ silicon germanium material is typically characterized by a sheet resistance of no greater than 0.1 ohm-cm in a specific embodiment.

Figure 7:
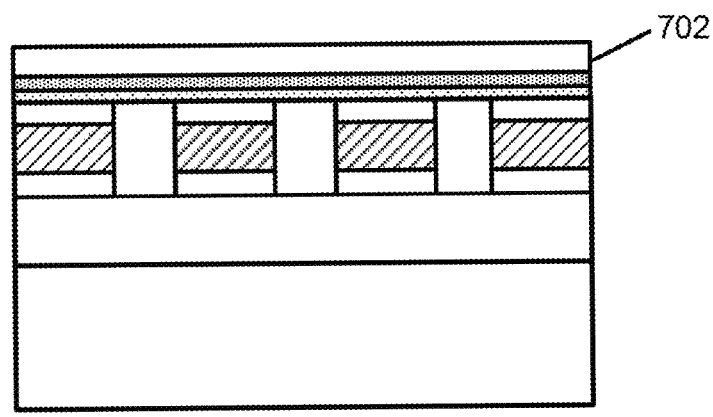

Referring to FIG. 7, the method deposits a resistive switching material 702 overlying the junction layer. The resistive switching material can be a second silicon material. The second silicon material can be an amorphous silicon material or a polycrystalline silicon material, and others, depending on the embodiment. In a specific embodiment, the resistive switching material comprises an amorphous silicon material. Deposition techniques can include a chemical vapor deposition process CVD), physical vapor deposition (PVD) process, an atomic layer deposition (ALD) process, and others. The chemical vapor process can be a low pressure chemical vapor deposition process, plasma enhanced chemical vapor deposition process, deposited using precursors such as silane, disilane, a suitable chlorosilane in a reducing environment, a combination, and others. Deposition temperature can range from 250 Degree Celsius to about 500 Degree Celsius. In some cases, deposition temperature ranges from about 400 Degree Celsius to about 440 Degree Celsius and no greater than about 450 Degree Celsius.

Figure 8:
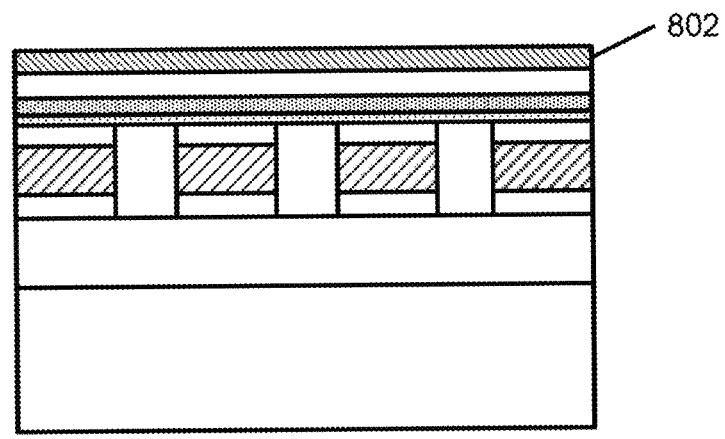

As shown in FIG. 8, the method includes depositing a second conductive material overlying the resistive switching material. The second conductive material 802 can be a metal material such as copper, silver, gold, platinum, palladium, nickel, zinc or others. The second conductive metal material is characterized by a suitable diffusivity in the resistive switching material in a presence of an electric field in a specific embodiment. For amorphous silicon material as the resistive switching material, the metal material can be silver or an alloy of silver. The alloy of silver comprises at least 80 percent of silver in a specific embodiment.

In various embodiments, the silver material forms a silver region in a portion of the amorphous silicon material upon application of the electric filed. The silver region comprises a plurality of silver particles, including silver ions, silver clusters, silver atoms and a combination. The plurality of silver particles may be formed in defect sites of the amorphous silicon material in a specific embodiment. The silver region further comprises a silver filament structure extending towards the first wiring structure. The filament structure can be characterized by a length, a distance between the silver particles, and a distance between the filament structure and the first electrode structure. In a specific embodiment, the resistive switching material (for example, the amorphous silicon material) is characterized by a resistance depending at least on a length, a distance between the silver particles, and a distance between the filament structure and the first electrode structure. Due to material mismatch, defect density is higher at an interface region formed between the amorphous silicon material 702, and junction material layer 604, and may cause a short. In various embodiments, the junction layer (for example, p+ polycrystalline silicon germanium material) controls an interfacial defect density for proper switching behavior of the resistive switching device in a specific embodiment.

Depending on the embodiment, the method can deposit an adhesion material and a diffusion barrier material overlying the second conductive material. The adhesion material can be a titanium material, tungsten material, or the like, in various embodiments. The diffusion barrier material can include titanium nitride, titanium tungsten, tantalum nitride, and others depending on the application. The adhesion material and the diffusion barrier material can be deposited using a chemical vapor deposition process, a physical vapor deposition process, atomic, including a combination of these, and others.

Figure 9:
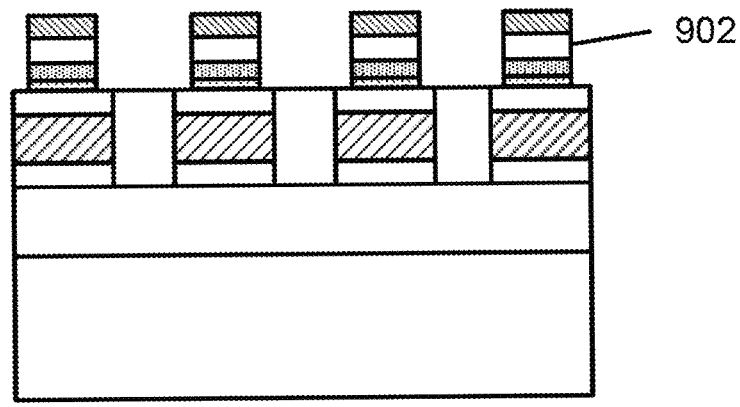

Various embodiments of the present invention then subjects the junction material 604 including the seed layer 602, the resistive switching material 702, the second conductive material 802, including the adhesion material and the diffusion barrier material to a pattern and etching process to form one or more pillar structures 902 overlying a respective first wiring structure 302-306, as shown in FIG. 9.

Figure 10:
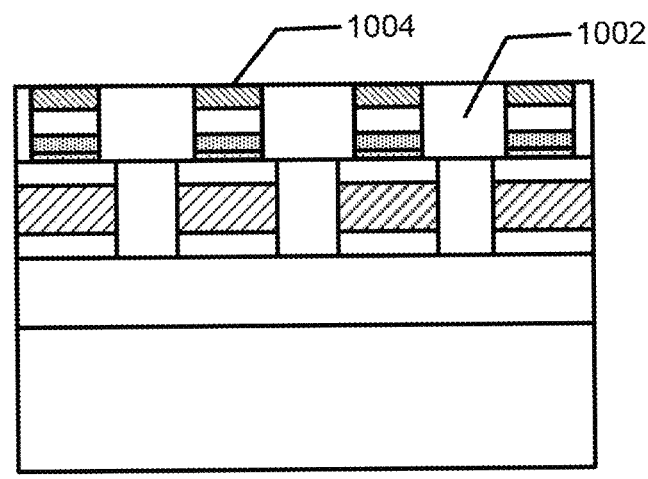

A third dielectric material 1002 is deposited overlying the one or more pillar structures and to fill the gaps between the pillar structures to isolate the pillar structures in a specific embodiment, and the third dielectric material 1002 may be planarized as shown in FIG. 10. In various embodiments, the third dielectric material can be silicon oxide, silicon nitride, a dielectric stack comprising alternative layers of silicon oxide and silicon nitride (for example, an ONO), a high K dielectric, a low K dielectric, or a combination, and others depending on the application. When the third dielectric material is subjected to one or more mechanical or chemical planarizing processes a top surface region 1004 of the diffusion barrier material may be exposed, and isolate each of the pillar structure in a specific embodiment. In various embodiments, the planarizing process can be a chemical mechanical polishing process using the diffusion barrier material as a polish stop layer in a specific embodiment. Alternatively, an etch back process or a combination of etch back process and chemical mechanical polishing process may be used.

Figure 11:
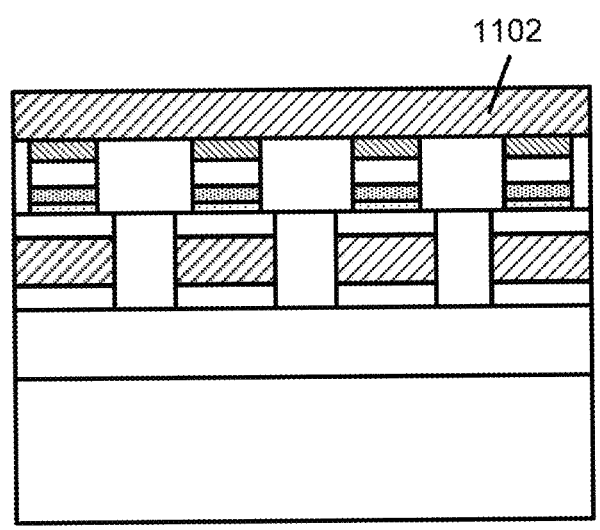

As shown in FIG. 11, the method includes depositing a second wiring material 1102 overlying the one or more pillar structures and the third dielectric material. The second wiring material can be aluminum, copper, tungsten, silver or a semiconductor material having a suitable conductivity. In a specific embodiment, the second wiring material can include at least one adhesion material and at least one diffusion barrier material in a specific embodiment. For example, titanium can be formed overlying the pillar structure and the third dielectric material and titanium nitride can formed overlying titanium for adhesion/diffusion barrier material. In various embodiments, the second wiring material is subjected to a pattern and etch process to form a second wiring structure overlying the structure illustrated in FIG. 11. The second wiring structure may be locally elongated in shape and spatially configured to extend in a second direction. The second direction is at an angle with respect to the first direction of the first wiring structure. In a specific embodiment, the second direction is orthogonal to the first direction in a specific embodiment.

In various embodiments, a third dielectric material overlying the second wiring structure may be applied to isolate each of the second wiring structures. The method may then include formation of one or more passivation layers and global wiring structures and others depending on the application.

Depending on the embodiment, there can be other variations. For example, the seed layer can be optional for certain embodiments while the p+ silicon germanium material deposited has the desirable crystalline and conductive characteristics at a deposition temperature not higher than 450 Degree Celsius. Additionally, the active metal material (for example, the silver material can be formed in a via structure to further reduce an effective size of the device. Of course one skilled in the art would recognize other variations, modifications, and alternatives.

Figure 12:
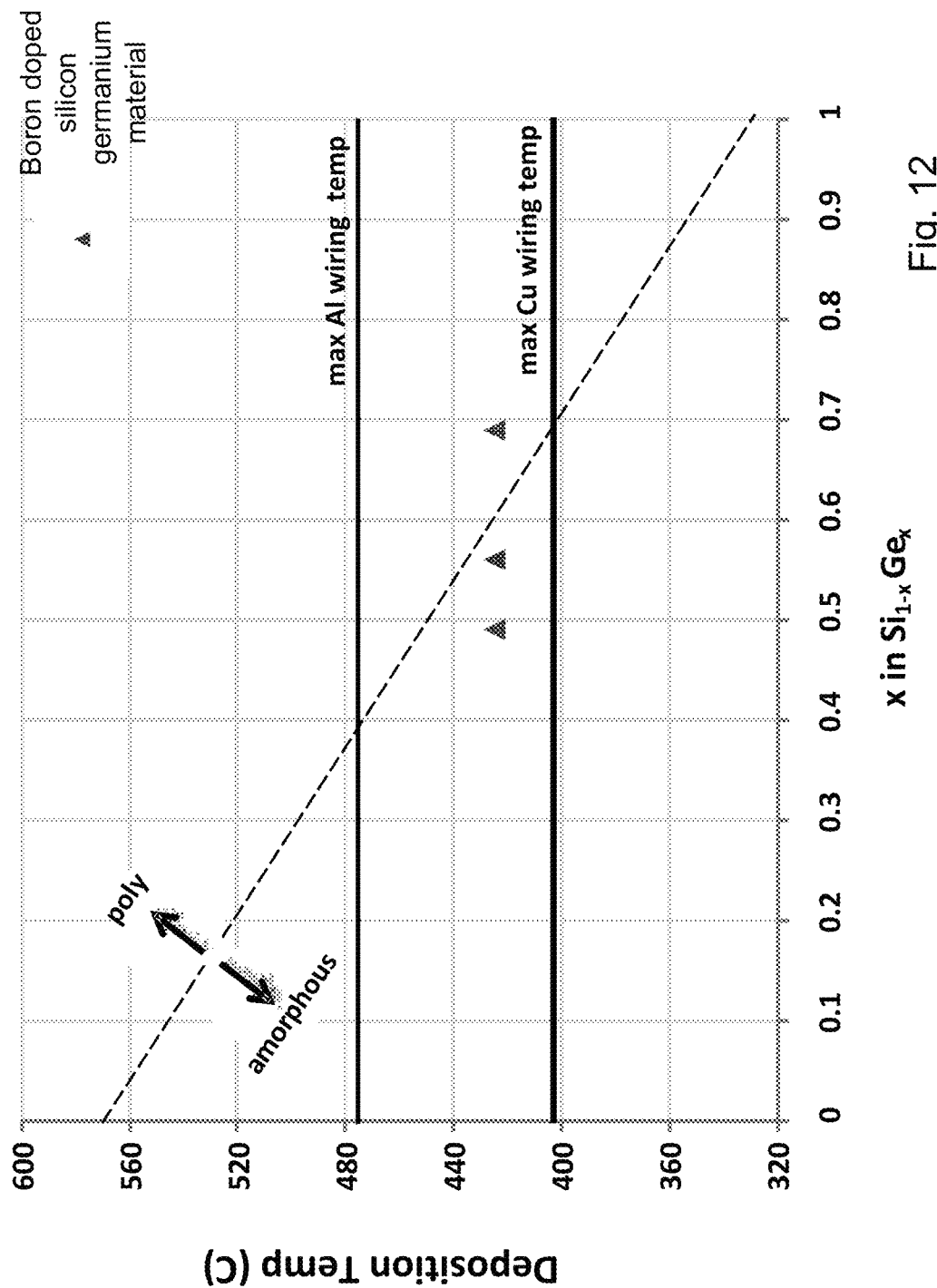
FIG. 12 is a simplified plot illustrating a crystalline temperature of a silicon germanium material as a function of germanium composition according to an embodiment of the present invention.

Referring now to FIG. 12. A simplified plot of deposition temperature of crystalline silicon germanium material as a function of germanium composition. As illustrated, deposited silicon germanium material may be polycrystalline without further anneal. As shown, the minimum deposition temperature for a polycrystalline silicon germanium material decreases monotonically (dotted line) as the germanium concentration increases.

In various embodiments, CMOS processes typically use copper and aluminum as interconnects, accordingly, the deposition temperature for silicon germanium may be limited as a CMOS process. As illustrated, when a process uses copper interconnects, the temperature of subsequent processes should not be higher than about 400 Degree Celsius; and when the process uses aluminum interconnects, the process temperature should not be higher than about 480 Degree Celsius.

Referring back to FIG. 12, in some embodiments, one germanium composition in the germanium material is greater than about x=0.65 when the process uses copper interconnects. In such a case, the deposition temperature of the germanium material should be no higher than about 400 degrees C. As the ratio of germanium increases, the deposition temperature may be lowered. For example, at x=0.8 germanium, the deposition temperature may range from about 380 degrees C. to no higher than about 400 degrees C. In other embodiments, a composition of about x=0.4 or greater of germanium may be used when the process uses aluminum interconnects. In such a case, the deposition temperature of the germanium material should be about 480-490 degrees C. As the ratio of germanium increases, the deposition temperature may be lowered. For example, at x=0.5 germanium, the deposition temperature may range from about 450 degrees C. to no higher than about 490 degrees C.; at x=0.65 germanium, the deposition temperature may range from about 400 degrees C. to no higher than about 490 degrees C.; and the like. As indicated above, a useful end deposition temperature for the germanium material may range from about 400 degrees C. to about 450 degrees C.

As shown in FIG. 12, impurity material such as a boron species provides a dopant source to increase conductivity of the silicon germanium material and does not affect the polycrystalline characteristic but can further lower the crystallization temperature.

Figure 13:
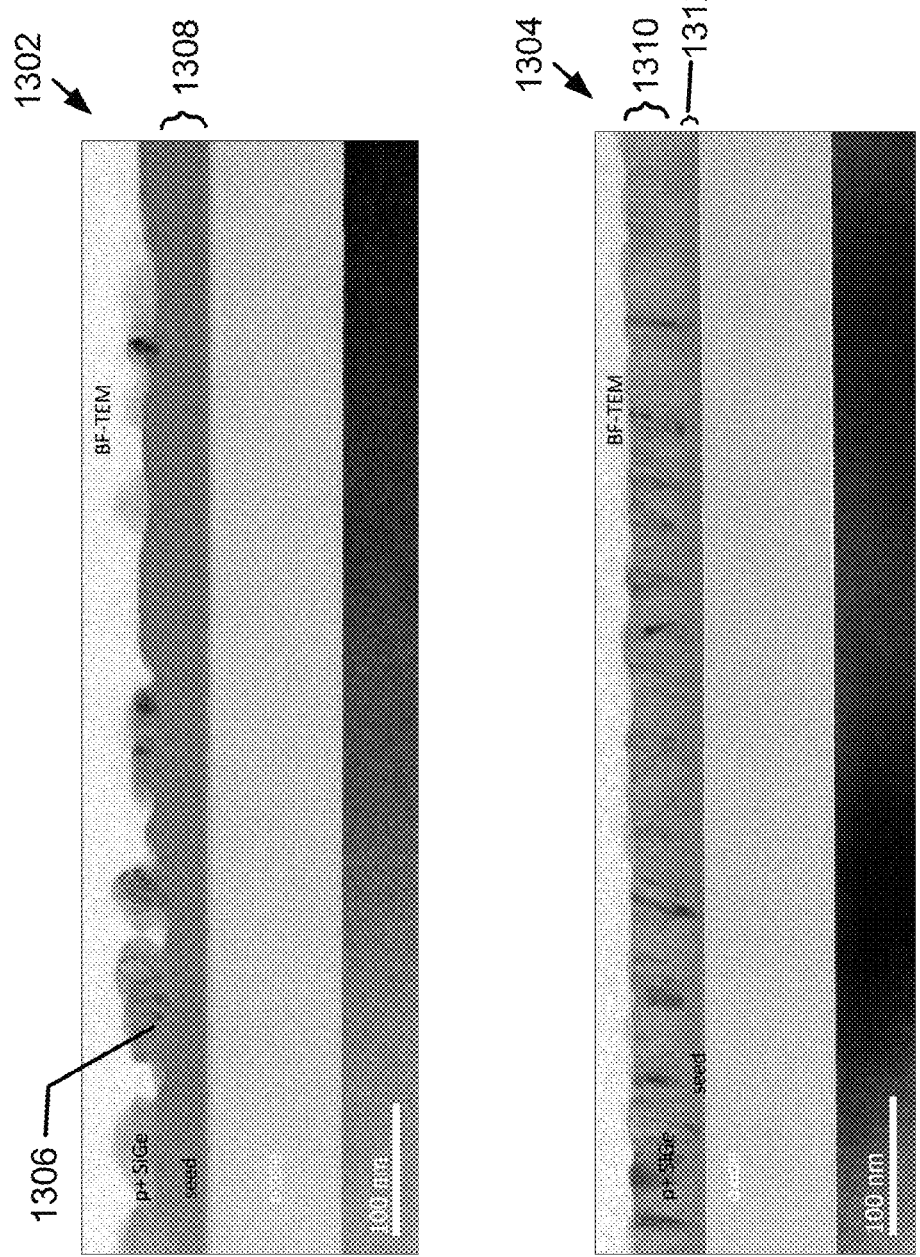
FIG. 13 illustrates transmission electron microscope images of the silicon germanium material formed under different experiment conditions according to embodiments of the present invention.

Referring to FIG. 13, transmission electron microscope (TEM) images are shown. As shown in image 1302, p+ silicon germanium material layer 1306 is formed overlying a silicon seed layer 1308. P+ silicon germanium material layer 1306 is substantially amorphous, only irregular and non-continuous crystals are formed resulting in a rough surface. Due to lack of crystallization, the p+ silicon germanium material has a high sheet resistance.

In contrast, image 1304 is obtained from a p+ silicon germanium material 1310 deposited overlying a silicon seed layer 1312. P+ silicon germanium material layer 1310 has polycrystalline grains extending continuously throughout and has a low sheet resistance (about 0.02 ohm-cm). Additionally, in this example, P+ silicon germanium material layer 1310 is free of voids and exhibits desirable conductivity. As shown, seed layer 1308 is at least twice as thick as seed layer 1312. From the experiment results, the silicon seed layer should have an optimized thickness and in some cases no greater than 100 Angstroms in a specific embodiment.

In one example, p+ silicon germanium material has a measured thickness of about 59.5 nm overlying a silicon seed layer of a measured thickness of about 6.9 nm. In various examples, the p+ silicon germanium material is continuous, free of voids, and exhibits desirable conductivity. The process parameters is summarized as follow:

| Parameter | Si Seed | SiGe |
|---|---|---|
| Temperature (° C.) | 425 | 425° C. |
| Pressure (mTorr) | 300 | 300 mTorr |
| Time (minute) | 1-3 | 12 min (6 min POR) |
| Flow Rates | | |
| $Si_2H_6$ | 150 sccm | 0 sccm |
| $SiH_4$ | 0 sccm | 200 sccm |
| $GeH_4$ | 0 sccm | 100 sccm |
| $BCl_3$ | 0 sccm | 10 sccm |

In various embodiments, the memory structures illustrated in FIGS. 1-11 may be performed as part of a back-end CMOS process. Structures underlying these memory structures may include memory control circuitry, processing circuitry (e.g. CPU, GPU), logic structures (e.g. FPGA), or the like. In various embodiments, a component or device including the memory structures may be combined with one or more components upon a common chip substrate, upon a common circuit board, or the like. The other components may include processing components (e.g. CPU, GPU), communications components (e.g. RF, WiFi), output display and display controllers, and the like. A resulting device may include a computer, a hand-held device (e.g. cell phone, tablet device), or the like. Such devices, and others are contemplated to be within the scope of the present invention.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method of forming a non-volatile memory device, comprising:
   providing a substrate having a surface region;
   depositing a first dielectric material overlying the surface region of the substrate;
   forming a first wiring structure overlying the first dielectric material;
   optionally forming a diffusion barrier material overlying and in contact with the first wiring structure;
   depositing a silicon material overlying the first wiring structure and in contact with the first wiring structure or optionally in contact with the diffusion barrier material, the silicon layer being characterized by a thickness of greater than 0 Angstroms but no greater than about 60 Angstroms, wherein depositing the silicon material comprises depositing the silicon material using a physical vapor deposition process;
   depositing a silicon germanium material at a depositing temperature ranging from about 400 Degree Celsius to about 490 Degree Celsius overlying the first wiring structure and in contact with the silicon material, using the silicon material as a seed layer, wherein the silicon germanium as-deposited being substantially free of voids and as-deposited having a polycrystalline characteristic;
   depositing a resistive switching material comprising an amorphous silicon material overlying and in contact with the silicon germanium material;
   depositing a conductive material overlying the resistive material; and
   forming a second wiring structure overlying the conductive material.

2. The method of claim 1 wherein the silicon germanium material has a p+ impurity characteristic.

3. The method of claim 2 wherein the p+ impurity species is provided by a species selected from a group consisting of: boron species, an aluminum species, and a gallium species.

4. The method of claim 2 wherein the silicon germanium material having the p+ impurity characteristic is characterized by a sheet resistance of less than about 0.1 ohm-cm.

5. The method of claim 3 wherein the p+ impurity species in the silicon germanium material is activated free from an anneal process.

6. The method of claim 1 wherein the silicon germanium material has a composition $Si_{1-x}Ge_x$, where x is within a range given by: $0.0<x\leq$ about 0.7.

7. The method of claim 1 wherein depositing the resistive switching material comprises depositing the amorphous silicon material using a process selected from a group consisting of: a low pressure chemical vapor deposition process, a plasma enhanced chemical vapor deposition process, a physical vapor deposition process, or a combination thereof.

8. The method of claim 7 wherein depositing the amorphous silicon material comprises depositing the amorphous silicon material at a deposition temperature ranging from about 400 Degree Celsius to about 450 Degree Celsius.

9. The method of claim 1 wherein the substrate comprises one or more CMOS devices formed thereon, and wherein the one or more CMOS devices comprise controlling circuitry for the non-volatile memory device.

10. The method of claim 1 wherein forming the first wiring structure comprises depositing a first conductive material selected from a group consisting of: a doped polysilicon material, a copper material, an aluminum material, a tungsten material, and a combination thereof.

11. The method of claim 1 wherein forming the first wiring structure further comprises etching the first conductive material to form the first wiring structure, wherein the first wiring structure is elongated in shape and configured to spatially extend in a first direction.

12. The method of claim 1 wherein forming the second wiring structure comprises:
    depositing a metal material in physical and electrical contact with the switching material; and
    etching the metal material to form the second wiring structure, wherein the second wiring structure is elongated in shape and configured to spatially extend in a second direction orthogonal to the first direction.

13. A method of forming a non-volatile memory device, comprising:
    providing a substrate having a surface region;
    depositing a first dielectric material overlying the surface region of the substrate;
    forming a first wiring structure overlying the first dielectric material;
    optionally forming a barrier layer or an adhesion layer overlying and in contact with the first wiring structure;
    depositing an undoped silicon material overlying and in contact with the first wiring structure, or optionally in contact with the barrier layer or the adhesion layer, the undoped silicon layer being characterized by a thickness of no greater than about 100 angstroms;
    depositing a silicon germanium material at a depositing temperature ranging from about 400 Degrees Celsius to about 490 Degrees Celsius overlying and in contact with the undoped silicon material and utilizing the undoped silicon material as a seed layer, the silicon germanium material having a polycrystalline characteristic;
    depositing a resistive switching material comprising an amorphous silicon material overlying and in contact with the silicon germanium material;
    depositing a conductive material overlying the resistive switching material; and
    forming a second wiring structure overlying the conductive material.

14. The method of claim 13, further comprising depositing the resistive switching material in contact with the silicon germanium material.

15. The method of claim 13, further comprising selecting an active metal for the conductive material, the active metal comprising particles capable of drifting or diffusing within the resistive switching material.

16. The method of claim 15, wherein the particles are responsive to a voltage applied to the non-volatile memory device to form a conductive filament at least in part through the resistive switching material from a first surface of the resistive switching material near the conductive material toward a second surface of the resistive switching material near the silicon germanium material.

17. The method of claim 13, further comprising depositing a second adhesion layer between the first dielectric material and the first wiring structure, wherein the adhesion layer is in contact with at least one of the first dielectric material or the first wiring structure.

18. The method of claim 13, further comprising doping the silicon germanium material with a p+ impurity characteristic.

19. The method of claim 18, further comprising controlling the doping of the silicon germanium material with the p+ impurity characteristic to achieve a sheet resistance of the silicon germanium material of less than about 0.1 ohm-cm.

20. The method of claim 13, wherein depositing the silicon germanium material further comprises depositing a silicon germanium alloy having a composition $Si_{1-x}Ge_x$, where x is within a range given by: $0.0 < x \leq$ about $0.7$.

* * * * *